United States Patent [19]
Anderson et al.

[11] Patent Number: 5,523,629
[45] Date of Patent: Jun. 4, 1996

[54] PLASTIC ENCAPSULATED MICROELECTRONIC DEVICE

[75] Inventors: Samuel J. Anderson, Tempe; John Baird; Martin A. Kalfus, both of Scottsdale, all of Ariz.

[73] Assignee: Motorola, Inc., Schaumburg, Ill.

[21] Appl. No.: 278,205

[22] Filed: Jul. 21, 1994

Related U.S. Application Data

[62] Division of Ser. No. 52,962, Apr. 27, 1993, Pat. No. 5,378,928.

[51] Int. Cl.$^6$ .................. H01L 23/28; H01L 23/34; H01L 23/10
[52] U.S. Cl. .................. 257/787; 257/723; 257/779; 257/706
[58] Field of Search .................. 257/706, 779, 257/723, 765, 724, 766, 726, 707, 727, 787, 675, 692, 793, 788, 786

[56] References Cited

U.S. PATENT DOCUMENTS

| | | | |
|---|---|---|---|
| 4,218,695 | 8/1980 | Egerbacher et al. | 257/726 |
| 4,568,962 | 2/1986 | Kalfus | 257/787 |
| 4,639,759 | 1/1987 | Neidig et al. | 357/74 |
| 4,920,405 | 4/1990 | Itoh et al. | 257/724 |
| 5,028,741 | 7/1991 | Sanders et al. | 174/52.2 |
| 5,059,105 | 10/1991 | Baird | 425/116 |
| 5,083,368 | 1/1992 | Frank | 29/840 |
| 5,105,259 | 4/1992 | McShane et al. | 357/72 |
| 5,153,453 | 10/1992 | Walters | 307/317.1 |
| 5,172,215 | 12/1992 | Kobayashi et al. | 257/724 |

FOREIGN PATENT DOCUMENTS

| | | | |
|---|---|---|---|
| 58-75857 | 5/1983 | Japan | 257/787 |

OTHER PUBLICATIONS

Lewis, Merion, "SAW Filters Employing Interdigitated Interdigital Transducers, IIDT", Royal Signals and Radar Establishment, Malvern, Worcestershire, United Kingdon, 1982 Ultrasonics Symposium, pp. 12–17.

*Primary Examiner*—Sara W. Crane
*Assistant Examiner*—S. V. Clark
*Attorney, Agent, or Firm*—Bruce T. Neel

[57] ABSTRACT

An encapsulated microelectronic device (100) including a base (101) and a semiconductor device (305) having a top and a bottom. The bottom is attached to the base (101). The semiconductor device (105) has a thickness in the range from one-fourth to three-fourths of a millimeter and has a bottom metallization consisting of aluminum (407)/chromium (405)/nickel (403)/gold (401). The semiconductor device (305) has a contact (115) attached to the top. The encapsulated microelectronic device (100) has a molded top (120) surrounding the semiconductor device (305). The molded top (120) is made from low stress molding material.

12 Claims, 2 Drawing Sheets

PLASTIC ENCAPSULATED MICROELECTRONIC DEVICE

This is a division of application Ser. No. 08/052,962, filed Apr. 27, 1993, now Pat. No. 5,378,928.

FIELD OF THE INVENTION

This invention relates, in general, to the field of microelectronic device packages, and more particular, to a semiconductor package having greater resistance to stress fractures.

BACKGROUND OF THE INVENTION

Recent trends in manufacturing of electronic equipment place increased emphasis on reliability and robustness of components employed in such equipment. Power devices pose particular problems for several reasons. Of necessity, die for power devices are formed from brittle materials and have large areas. Power devices produce heat during normal operation, providing need for heatsinking and also exacerbating stresses arising from differences in thermal expansion coefficients between materials employed in such devices. Typically, die are thinned in order to improve heat transfer from active device regions to a heatsink and to reduce power dissipation by reducing electrical resistance. Power devices are also generally placed into close proximity with and physically coupled to an external heatsink to improve heat transfer thereto. This places further stresses on the package and die contained therein. Additional problems arise in forming and/or sealing packages containing such die without damaging the die.

What are needed are methods and apparatus for providing physical protection and heatsinking for power microelectronic devices which also provide improved device reliability and robustness.

SUMMARY OF THE INVENTION

Briefly stated, there are provided a new and improved encapsulated microelectronic device and a method for manufacturing same. The device includes a base and at least one semiconductor device. The semiconductor device has a top and a bottom, with the bottom attached to the base. The semiconductor device has a thickness in the range from one-fourth to three-fourths of a millimeter and has a bottom or backside metallization consisting of aluminum/chromium/nickel/gold. A contact is attached to the top. A molded low stress molding material surrounds the semiconductor device.

DETAILED DESCRIPTION OF THE DRAWINGS

Figure 1:
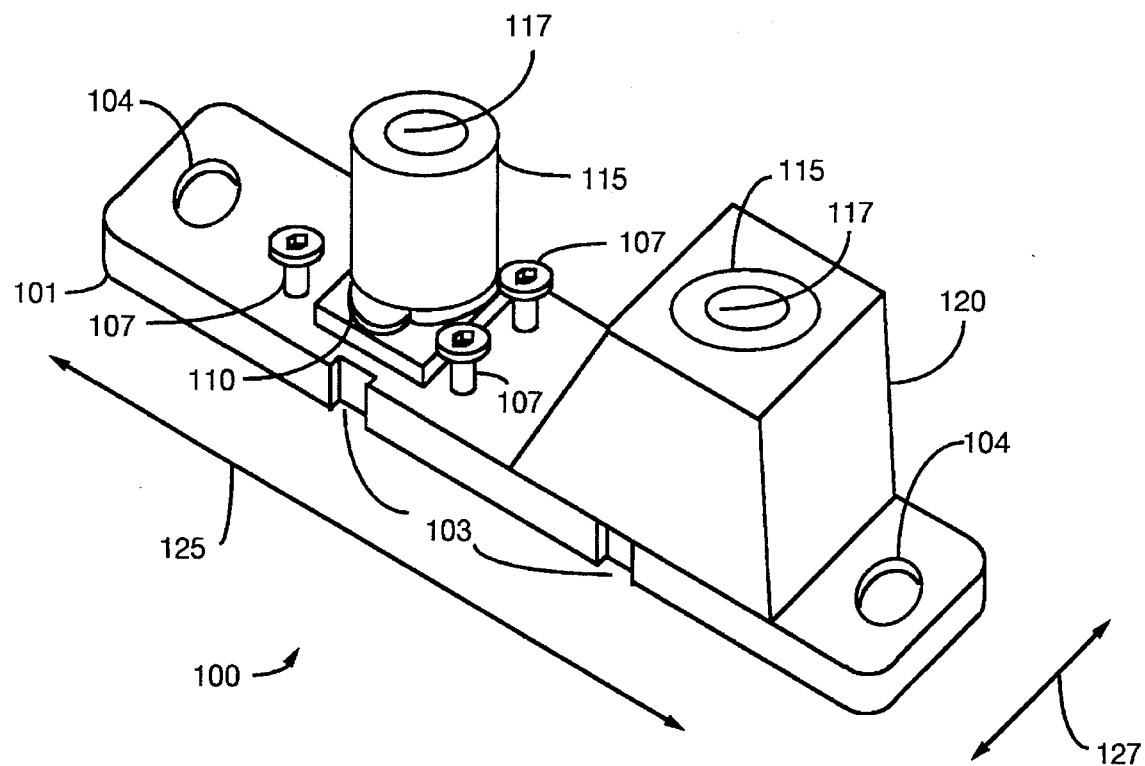
FIG. 1 is an isometric sketch of an encapsulated microelectronic device in accordance with the present invention.

FIG. 1 is an isometric sketch of device 100, an encapsulated microelectronic device, in accordance with the present invention. Device 100 has base 101 having molding injection gates 103, mounting openings 104, and mold locking posts 107. Typically, base 101 is substantially planar, providing the advantage of simplified manufacturing, and is attached to an external heatsink (not shown) via fasteners (e.g., screws, rivets, etc., not shown) extending through openings 104, providing intimate contact and effective heat transfer to the external heatsink. Base 101 has a long axis 125 and a short axis 127. In a preferred embodiment, base 101 will have semiconductor devices mounted thereon near each gate 103. For ease of explanation, a molded housing 120 is shown in only one area even though housing 120 will be formed simultaneously in both areas in an actual device 100.

Device 100 further has knurled terminals 115 atop and electrically contacting (e,g., anodes of) die stacks 105 and desirably soldered thereto. Die stacks 105 desirably include power semiconductor devices (e.g., Schottky diodes) having electrical and metallurgical contact with base 101 (e.g., cathode). Die stack 105 will be described in greater detail hereinafter. One example of terminal 115 is discussed in detail in "Plastic Encapsulated Semiconductor Power Device Means And Method", issued to M. Kalfus, U. S. Pat. No. 4,568,962 (Feb. 4, 1986), which is incorporated herein by reference. Terminals 115 fashioned from nickel-plated brass and having knurled or otherwise reticulated and/or stippled external cylindrical surfaces (to facilitate gripping molded housing 120) and threaded interior cylindrical surfaces 117 (for attachment of external electrical connections, not shown) and including copper bases 110 having dimpled contacts (not shown) compressed against and soldered to die stacks 105 are preferred.

Molded housing 120 is desirably formed from novolac epoxy such as PLASKON ULS12, available from Plaskon Electronic Materials, Inc., of Philadelphia, Pa., having a glass transition temperature of 155° C. and a temperature coefficient of expansion of 12.5 cm/cm/° C $\times 10^{-6}$ (cm =centimeter). This low stress molding compound typically provides axial forces on die 105 of less than about 225 kg (kilograms) and desirably provides axial forces of 65 kg or less and provides bending moments on die 103 which are usefully less than 170 cm-kg, desirably less than 80 cm-kg and preferably are 17 cm-kg or less. In an alternative emmbodiment of the present invention, molded housing 120 is formed from polyester based resin.

Figure 2:
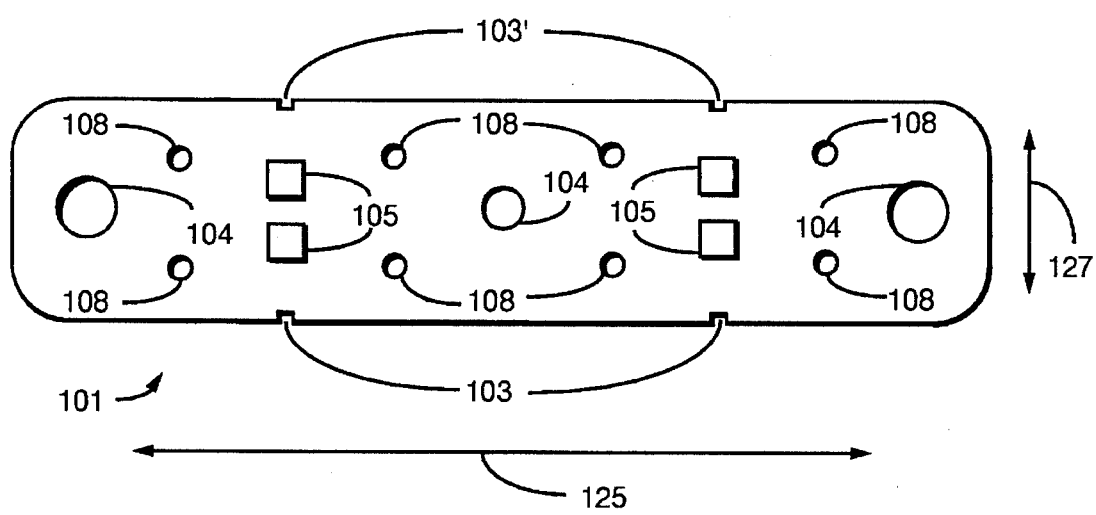
FIG. 2 is a sketch of a top view of a base and die stacks of the device of FIG. 1.

FIG. 2 is a sketch of a top view of base 101 and die stacks 105 in accordance with the present invention. Holes 108 extending through base 101 are aligned to provide a "focus" for deforming stresses (e.g., stresses: from attaching base 101 via screws, not shown, inserted through mounting openings 104, and threaded into an external heatsink, not shown). This allows base 101 to bend along a line largely parallel to short axis 127 and intersecting holes 108. This causes such deforming stresses to be concentrated along the line joining holes 108, with minimal stress being transferred to die stacks: 105.

Referring to FIGS. 1 and 2, a preferred embodiment is described wherein molded housing 120 attaches to base 101, which attachment is aided by mold locking posts 107. Mold locking posts 107 desirably are self tapping screws 107 threaded into holes 108 in base 101. Self tapping screws 107 are placed to at least a depth which ensures that the molding compound forming molded housing 120 is not extruded through their threads and yet so that the threaded bottoms of screws 107 are one-fourth to one-half mm (millimeter) short of the bottom surface of base 101. This ensures that screws 107 do not extend beyond the bottom surface and disrupt the planarity of base 101. Screws 107 having forty threads per inch (e.g., 4–40 screws) have been found to provide effective sealing of holes 108 when screwed at least two full turns (i.e., three threads deep) into holes 108. Self tapping screws 107 having internal Allen heads (also known as hex heads) or other heads adapted to automated machine insertion are preferred.

In applications requiring a plurality of die stacks 105, placement of die stacks 105 in groups aligned along short axis 127 (i.e., side by side) is preferred. This allows separation of pairs of mold locking posts 107 along long axis 125 to be reduced, providing greater effective stiffness to those portions of base 101 upon which die stacks 105 are mounted. This arrangement results in reduced stress on die stacks 105 and hence reduced breakage thereof, both during molding of molded housing 120 and during subsequent mounting and operation of device 100.

Gateless molding of molded housing 120 is preferred, with gates 103, for example, for injection of molding compound and gates 103', for example, for venting of gas during molding. Placement of die stacks 105 on a planar surface of base 101 provides reduced stress on die stack 105 during and after molding when compared, for example, to recessing die stacks 105 into depressions in base 101. This is because substantial shearing forces often develop between base 101 and molded housing 120 during molding due to volumetric changes of molded housing 120 and also in response to differences in thermal coefficients of expansion between molded housing 120 and base 101 during theral cycling of device 100.

Figure 3:
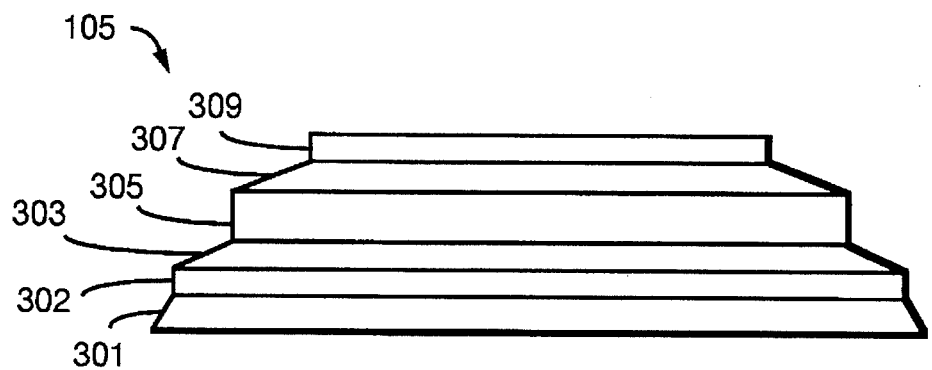
FIG. 3 depicts a sectional side view of a die stack.

FIG. 3 is a sketch of a sectional side view of die stack 105. Die stack 105 has bottom solder layer 301, bottom spacer 302, solder layer 303, die 305, solder layer 307 and top spacer 309. Solder layers 303 and 307 (e.g., PbInAg solder circa 50 micrometers thick) provide metallurgical attachment of bottom and top spacers 302, 309, respectively, to die 305, while solder layer 301 (similar to layers 303 and 307) provides metallurgical attachment of die stack 105 to base 101 (FIG. 1). Bottom spacer 302, typically one-fourth mm thick, and top spacer 309, typically three-eighths mm thick, desirably are molybdenum squares.

Backlapping die 305 produces defects (e.g., point defects) weakening die 305 and rendering die 305 susceptible to fracture, either during molding of molded housing 120 (FIG. 1) or during subsequent handling, installation and/or operation of device 100. Backlapping is a manufacturing step wherein die 305 is ground with an abrasive (e.g., an alumina slurry), to reduce the thickness of die 305 thereby providing advantages of improved heatsinking and of reduced forward voltage drop, the latter resulting from decreased series resistance and both reducing heat dissipation by die 305 as well as improving device efficiency.

Backlapping of die 305 may be eliminated, allowing thicker and therefore sturdier die 305 to be incorporated into device 100 (FIG. 1), without incurring excessive forward voltage drop and/or undue die-to-heatsink thermal resistance, by employing a low contact resistance material (e.g., aluminum) as a back (ohmic) contact.

Figure 4:
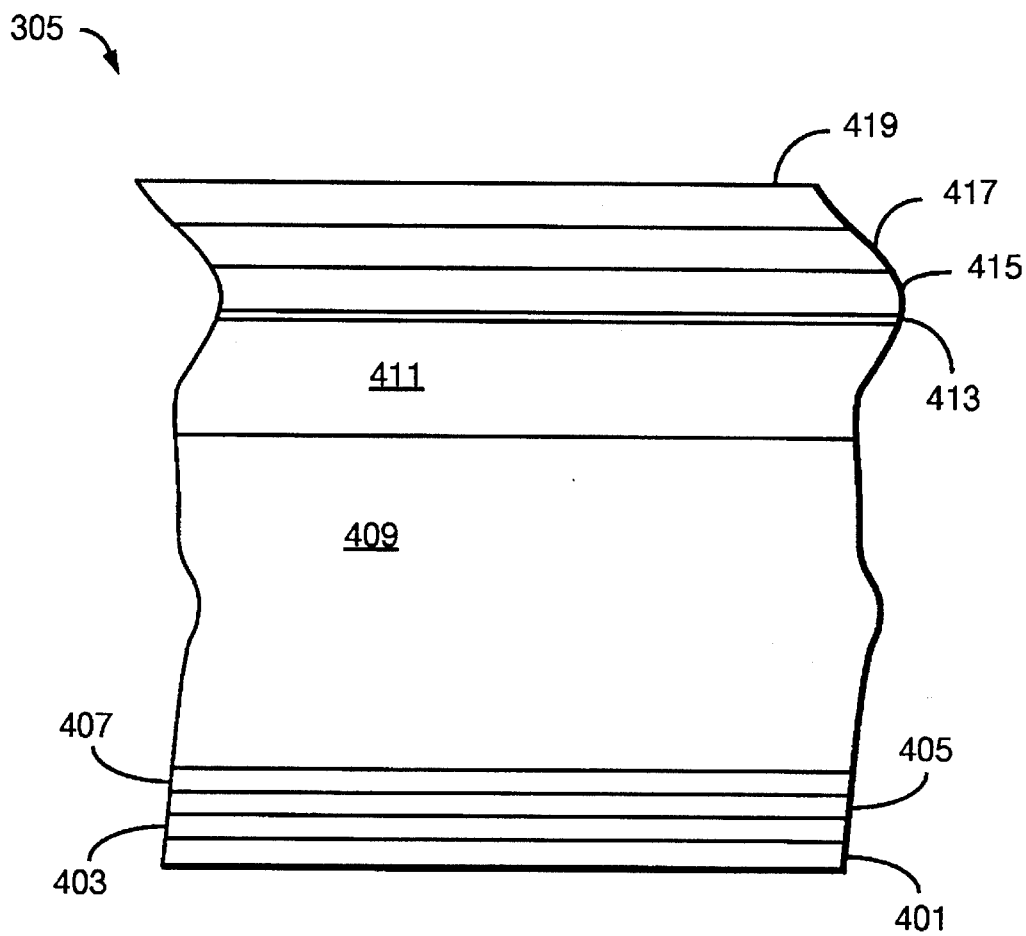
FIG. 4 illustrates an enlarged sectional side view of a portion of a semiconductor die used in the present invention.

Referring now to FIG. 4, a portion of a preferred embodiment of die 305 in accordance with the present invention is illustrated in enlarged cross-section. Die 305 desirably includes back metallization having a series of metal layers such as oxidation barrier layer 401 (e.g., Au, 0.1 Angstroms thick), solderable metal layer 403 (e.g., nickel 5000 Angsttoms thick), barrier metal layer 405 (e.g., chromium 750 Angstroms thick) and low contact resistance ohmic contact layer 407 (e.g., aluminum 16000 Angstroms thick). Layer 407 reduces forward voltage drop, thereby eliminating the necessity for thinning die 305 to achieve the lower forward voltage drop. Die 305 further includes an $n^{++}$silicon substrate 409 usefully in the range of three-eighths to five-eighths mm thick and desirably about one-half mm thick, having an n-type epitaxial layer 411 suitable to the reverse voltage characteristics desired and employing platinum (or PtSi) Schottky contact 413 having a series of metals deposited thereon (e.g., isolation metal layer 415/nickel layer 417/gold layer 419 having thicknesses of 3000/2000/1500 Angstroms, respectively). This materials combination provides solder-wettable surfaces (i.e., layers 403/401 and 417/419), facilitating metallurgical attachment of die stacks 105 to base 101 and to terminals 115 during assembly of device 100 (FIG. 1).

Thus, an encapsulated microelectronic device and method for manufacturing same are provided, overcoming specific problems and accomplishing certain advantages relative to prior art methods and mechanisms. A thicker semiconductor die is used wherein a novel backmetal system reduces forward voltage drop. Dice are mounted in pairs across a base and are encapsulated in a low stress encapsulant. Self tapping, machine insertable screws provide mold locking posts sealed against leaking molding compound during molding. A low stress molding compound increases manufacturing yields by reducing fracture during molding and also improves product life expectancy by reducing thermally induced stresses incurred during normal operation. The improvements over known technology are significant and include simplicity of manufacturing, improved fabrication yields and improved product robustness in installation and use.

What is claimed is:

1. A plastic encapsulated microelectronic device including in combination:

a base;

a semiconductor device having a top and a bottom, said bottom attached to said base, a metallization on said bottom comprising aluminum;

a contact attached to said top; and a molded top surrounding said semiconductor device, said molded top comprising low stress molding material, wherein said semiconductor device includes a pair of semiconductor die, said pair of semiconductor die disposed adjacent one another along a short axis of said base, and wherein said low stress molding material provides an axial force on said die of less than two hundred twenty-five kilograms.

2. A device as claimed in claim 1, wherein said low stress molding material comprises a novolac epoxy that provides an axial force on said die of less than sixty-five kilograms.

3. A device as claimed in claim 1, wherein said low stress molding material provides a bending moment on said die of less than one hundred seventy kilogram-centimeters.

4. A device as claimed in claim 1, wherein said low stress molding material provides a bending moment on said die of less than eighty kilogram-centimeters.

5. A device as claimed in claim 1, wherein said low stress molding material provides a bending moment on said die of less than seventeen kilogram-centimeters.

6. A device as claimed in claim 1, wherein said low stress molding material has a temperature coefficient of expansion of substantially $12.5 \times 10^{-6}$ centimeters per centimeter per degree Celsius.

7. A device as claimed in claim 1, wherein said low stress molding material has a glass transition temperature of substantially one hundred fifty five degrees Celsius.

8. An encapsulated microelectronic device comprising:

a base comprising a heatsink;

a semiconductor device having a top and a bottom, said bottom attached to said base, said semiconductor device having a solder-wettable metallization comprising a series of metal layers on said bottom, said solder-wettable metallization reducing electrical contact resistance to said bottom;

a contact attached to said top; and a molded top surrounding said semiconductor device, said molded top comprising low stress molding material, wherein said low stress molding material provides a bending moment on said semiconductor device of less than one hundred seventy kilogram-centimeters.

9. A device as claimed in claim 8, wherein said low stress molding material provides a bending moment on said semiconductor device of less than seventeen kilogram-centimeters.

10. A device as claimed in claim 8, wherein said low stress molding material provides a bending moment on said semiconductor device of less than eighty kilogram-centimeters.

11. An encapsulated microelectronic device comprising:

a base comprising heatsink;

a semiconductor device having a top and a bottom, said bottom attached to said base, said semiconductor device having a solder-wettable metallization comprising a series of metal layers on said bottom, said solder-wettable metallization reducing electrical contact resistance to said bottom;

a contact attached to said top; and a molded top surrounding said semiconductor device, said molded top comprising low stress molding material, wherein said low stress molding material has a temperature coefficient of expansion of substantially $12.5 \times 10^{-6}$ centemeters per centimeter per degree Celsius.

12. An encapsulated microelectronic device comprising:

a base comprising a heatsink;

a semiconductor device having a top and a bottom, said bottom attached to said base, said semiconductor device having a solder-wettable metallization comprising a series of metal layers on said bottom, said solder-wettable metallization reducing electrical contact resistance to said bottom;

a contact attached to said top; and a molded top surrounding said semiconductor device, said molded top comprising low stress molding material, wherein said low stress molding material has a glass transition temperature of substantially one hundred fifty five degrees Celsius.

* * * * *